US010170321B2

(12) United States Patent
Zhang et al.

(10) Patent No.: US 10,170,321 B2
(45) Date of Patent: Jan. 1, 2019

(54) ALUMINUM CONTENT CONTROL OF TIAIN FILMS

(71) Applicant: Applied Materials, Inc., Santa Clara, CA (US)

(72) Inventors: Wenyu Zhang, San Jose, CA (US); Wei V. Tang, Santa Clara, CA (US); Yixiong Yang, San Jose, CA (US); Chen-Han Lin, Campbell, CA (US); Yi Xu, San Jose, CA (US); Yu Lei, Belmont, CA (US); Naomi Yoshida, Sunnyvale, CA (US); Lin Dong, San Jose, CA (US); Drew Phillips, San Jose, CA (US); Srividya Natarajan, Saratoga, CA (US); Atashi Basu, Menlo Park, CA (US); Kaliappan Muthukumar, Tamilnadu (IN); David Thompson, San Jose, CA (US); Paul F. Ma, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/462,214

(22) Filed: Mar. 17, 2017

(65) Prior Publication Data

US 2018/0269065 A1 Sep. 20, 2018

(51) Int. Cl.
*H01L 21/285* (2006.01)
*C23C 14/14* (2006.01)
(Continued)

(52) U.S. Cl.
CPC ........ *H01L 21/28556* (2013.01); *C23C 12/00* (2013.01); *C23C 14/14* (2013.01); *H01L 21/28088* (2013.01); *H01L 21/28568* (2013.01); *H01L 29/456* (2013.01); *H01L 29/4966* (2013.01); *H01L 29/66795* (2013.01)

(58) Field of Classification Search
CPC ........ H01L 21/02628; H01L 21/26546; H01L 21/28556; H01L 21/28562; H01L 21/28568; H01L 21/30; H01L 21/3083; H01L 21/31612; H01L 21/82345; H01L 21/823821; H01L 21/823842;
(Continued)

(56) References Cited

U.S. PATENT DOCUMENTS 7,691,757 B2 4/2010 Haukka
8,110,491 B2 2/2012 Harada
(Continued)

FOREIGN PATENT DOCUMENTS

GB 2338594 12/1999
JP 2000022087 A 1/2000

OTHER PUBLICATIONS

PCT International Search Report and Written Opinion in PCT/US2018/020602 dated Jun. 12, 2018, 12 pages.

*Primary Examiner* — Moin Rahman
(74) *Attorney, Agent, or Firm* — Servilla Whitney LLC

(57) ABSTRACT

Described are methods of depositing a titanium aluminum nitride film on a substrate surface with a controlled amount of carbon. The methods include exposing a substrate surface to a titanium precursor, a nitrogen reactant and an aluminum precursor with purges of the unreacted titanium and aluminum precursors and unreacted nitrogen reactants between each exposure.

15 Claims, 3 Drawing Sheets

(51) Int. Cl.
*C23C 12/00* (2006.01)
*H01L 29/66* (2006.01)
*H01L 29/45* (2006.01)
*H01L 21/28* (2006.01)
*H01L 29/49* (2006.01)

(58) Field of Classification Search
CPC ........... H01L 29/4966; H01L 21/28088; H01L 29/66795; H01L 29/456; C23C 12/00; C23C 14/14
USPC ................................ 438/47, 96, 98, 125, 253
See application file for complete search history.

(56) References Cited

U.S. PATENT DOCUMENTS

| | | | |
|---|---|---|---|
| 2007/0116872 A1* | 5/2007 | Li | ........................... C23C 16/12 427/248.1 |
| 2010/0028636 A1 | 2/2010 | Vetter | |
| 2010/0102417 A1 | 4/2010 | Ganguli et al. | |
| 2013/0126815 A1* | 5/2013 | Kim | ........................ H01L 45/06 257/2 |
| 2013/0221445 A1* | 8/2013 | Lei | .................... H01L 21/28008 257/368 |
| 2014/0178659 A1 | 6/2014 | Wu et al. | |
| 2016/0343573 A1 | 11/2016 | Horii et al. | |

\* cited by examiner

ALUMINUM CONTENT CONTROL OF TIAIN FILMS

FIELD

Embodiments of the disclosure generally relate to methods of depositing a film. More particularly, embodiments of the disclosure are directed to methods of depositing a film of titanium aluminum nitride with a controlled amount of aluminum.

BACKGROUND

The migration of transistor technology from planar to Fin Field Effect Transistor (FinFET) requires conformal work function layers for multiple threshold voltages. Tuning the work function towards mid-gap can be achieved by adding Al into the work function layers, with different amounts of Al incorporated allowing for different amounts of voltage tuning, without adding physical thicknesses.

Therefore, there is a need in the art for methods of depositing films with controlled work function.

SUMMARY

One or more embodiments of the disclosure are directed to methods of depositing a TiAlN film on a substrate surface. The substrate surface is exposed to a titanium precursor to form a titanium-containing film on the substrate surface. Unreacted titanium precursor is purged from the substrate surface. The titanium-containing film on the substrate surface is exposed to a nitrogen reactant to form a TiN film on the substrate surface. Unreacted nitrogen reactant is purged from the substrate surface. The TiN film on the substrate surface is exposed to an aluminum precursor to form a TiAlN film.

Additional embodiments of the disclosure are directed to methods of depositing a TiAlN film on a substrate surface. The substrate surface is repeatedly exposed to a deposition sequence. The deposition sequence consists essentially of, in order, exposures to a titanium precursor, a first purge gas, a nitrogen reactant, a second purge gas and an optional aluminum precursor and third purge. The aluminum precursor and third purge are not immediately followed by a nitrogen exposure.

Further embodiments of the disclosure are directed to methods of depositing a TiAlN film on a substrate surface. The substrate surface is repeatedly exposed to a deposition sequence consisting essentially of, in order: exposing the substrate surface to a titanium precursor for a first dose time, the titanium comprising a titanium halide; purging unreacted titanium precursor for a first purge time; exposing the substrate surface to a nitrogen reactant for a second dose time, the nitrogen reactant comprising one or more of ammonia or hydrazine and the nitrogen reactant begin free of plasma; purging unreacted nitrogen reactant for a second purge time; and optionally, exposing the substrate surface to an aluminum precursor for a third dose time followed by purging unreacted aluminum precursor for a third purge time. One or more of the first dose time, the first purge time, the second dose time, the second purge time, the third dose time or the third purge time are controlled to deposit a TiAlN film with a controlled amount of aluminum.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
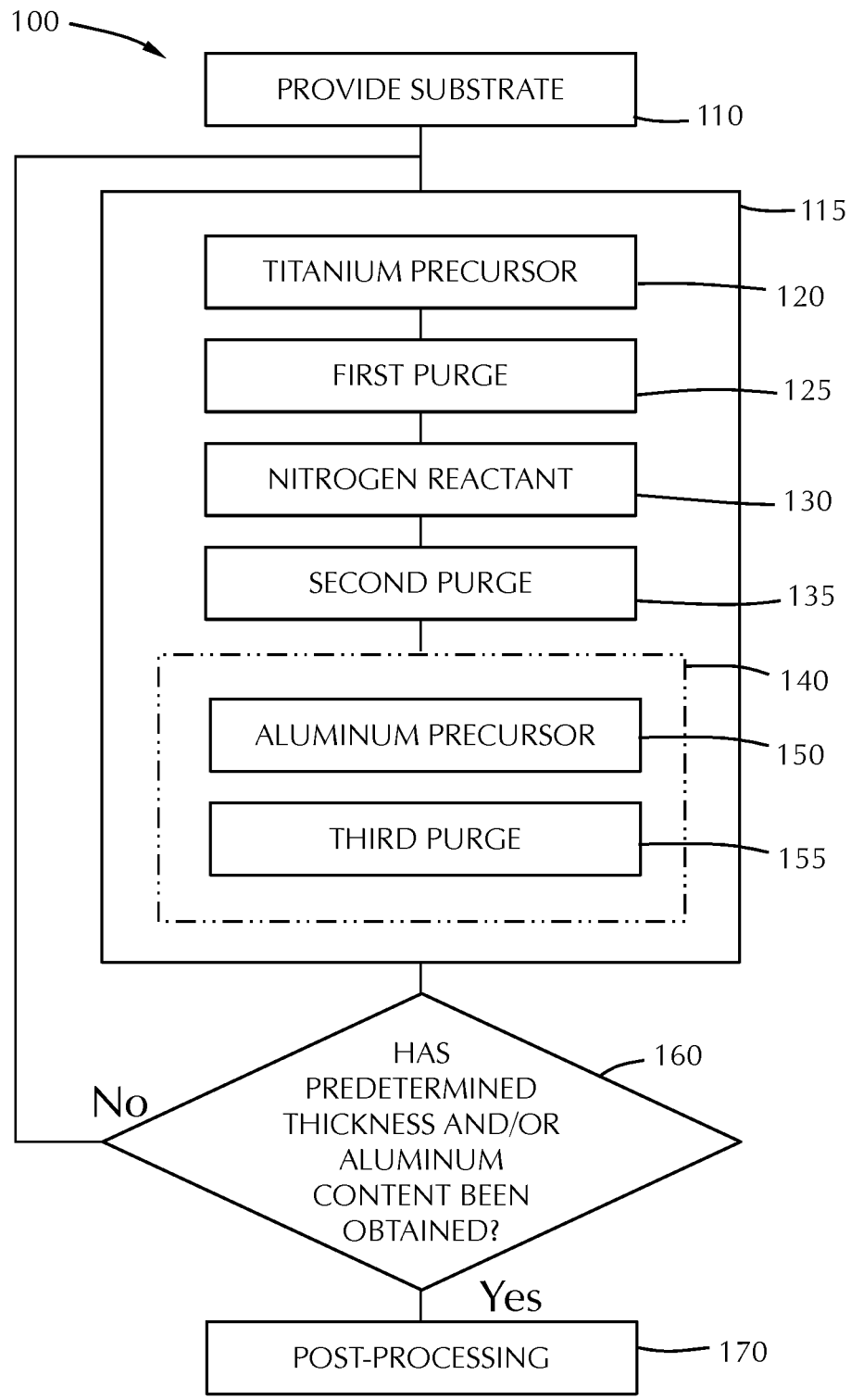
FIG. 1 illustrates a processing method in accordance with one or more embodiment of the disclosure.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated $Si_xGe_{1-x}$, and the second substrate surface may comprise a Si-containing dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods to deposit titanium aluminum nitride films (TiAlN) using titanium precursors (e.g., titanium halides), aluminum precursors (e.g. aluminum halides, metal organic aluminum compounds) and nitrogen containing reactants (e.g. ammonia, hydrazine, $N_2$). Varying amounts of aluminum can be doped to form thin films by varying, for example, precursor dose times, dose sequence or purge times.

One or more embodiments of the disclosure advantageously provide a TiAlN film with a controlled aluminum content. In some embodiments, the aluminum content can be tuned by controlling or changing precursor and purge dose times. Some embodiments advantageously provide processes without cross-reaction between titanium and aluminum precursors. Some embodiments provide methods to deposit uniform and repeatable TiAlN films.

FIG. 1 shows a processing method 100 in accordance with one or more embodiment of the disclosure. The processing method 100 deposits a titanium aluminum nitride film, referred to as a TiAlN film, on a substrate surface. Those skilled in the art will understand that the term "titanium aluminum nitride" and "TiAlN" are not referring to a stoichiometric amount of titanium, aluminum and nitrogen atoms. Rather, the terms are used to describe the overall composition of the film as having some titanium, some aluminum and some nitrogen.

A substrate with a substrate surface is provided at 110. As used in this regard, the term "provided" means that the substrate is moved into a position or processing chamber for deposition of the TiAlN film. The substrate surface can then be exposed to a deposition sequence 115 including reactive gas exposures and purges.

At 120, the substrate surface is exposed to a titanium precursor to form a titanium-containing film on the substrate surface. The titanium precursor can be any suitable titanium precursor including, but not limited to, titanium halides and organometallic titanium complexes. In some embodiments, the titanium precursor comprises a titanium halide. The titanium halide can be a chloride, bromide or iodide containing compound. In some embodiments, the titanium halide comprises substantially no fluorine atoms. As used in this regard, the term "substantially no fluorine atoms" means that the halogen atoms in the precursor comprises less than or equal to about 1%, 0.5% or 0.1% fluorine atoms on an atomic basis. In some embodiments, the titanium precursor comprises substantially only $TiCl_4$. In some embodiments, the titanium precursor comprises substantially only $TiBr_4$. In some embodiments, the titanium precursor comprises substantially only $TiI_4$. As used in this regard, the term "substantially only" means that the reactive species of the titanium precursor is greater than or equal to about 95%, 98% or 99% of the stated species on a molar basis. In some embodiments, the titanium precursor comprises a mixed halide titanium compound having the general formula $TiCl_x Br_y I_z$, where the sum of x, y and z is 4.

The dose time for the titanium precursor can be adjusted to ensure that the surface reaction is self-terminating. The dose time for the titanium precursor may be referred to as the first dose time to indicate that it is different than dose times associated with other processes. For example, once the precursor compound has adsorbed to the substrate surface to cover all of the active sites, no further surface reactions can occur. In some embodiments, the dose time for the titanium precursor is in the range of about 0.1 to about 20 seconds. In some embodiments, the dose time for the titanium precursor is in the range of about 0.5 to about 15 seconds, or in the range of about 0.8 to about 12 seconds or in the range of about 1 to about 10 seconds.

Once the dose time for the titanium precursor has been reached, the processing chamber is purged at first purge 125 to remove unreacted titanium precursor and/or reaction byproducts from the processing chamber and the substrate surface. The first purge 125 can be accomplished using any suitable process including one or more of vacuum application and inert gas flow. In some embodiments, the first purge 125 uses a combination of inert gas (e.g., Ar, He) with vacuum. The first purge time can be any suitable time to remove the unreacted precursor and byproducts from the substrate surface. A shorter first purge time can provide a process with greater throughput as long as there are substantially no compounds remaining that can react with the subsequent process gases.

Once the substrate surface has been purged of unreacted titanium precursor and reaction byproducts, the substrate surface is exposed to a nitrogen reactant 130. The nitrogen reactant can react with the titanium species previously chemisorbed on the substrate surface to create a titanium nitride film. The nitrogen reactant can be any suitable nitrogen compound including, but not limited to, ammonia, hydrazine, activated molecular nitrogen (i.e., by passing the nitrogen across a hot wire) or a derivative thereof. In some embodiments, the nitrogen reactant comprises substantially only ammonia. In some embodiments, the nitrogen reactant comprises substantially only hydrazine. As used in this regard, the term "substantially only" means that the reactive species of the nitrogen reactant is greater than or equal to about 95%, 98% or 99% of the stated species on a molar basis. In some embodiments, the nitrogen reactant is not provided as a plasma or co-flowed with a plasma.

The dose time for the nitrogen reactant can be adjusted to ensure that the surface reaction is self-terminating. The dose time for the nitrogen reactant may be referred to as the second dose time to indicate that it is different than the first dose time associated with the titanium precursor. For example, once the nitrogen reactant has reacted with all of the available chemisorbed titanium species, no further surface reactions occur. In some embodiments, the dose time for the nitrogen reactant is in the range of about 0.5 to about 15 seconds. In some embodiments, the dose time for the titanium precursor is in the range of about 1 to about 10 seconds.

Once the dose time for the nitrogen reactant has been reached, the processing chamber is purged at second purge 135 to remove unreacted nitrogen reactant and/or reaction byproducts from the processing chamber and the substrate surface. The second purge 135 can be accomplished using any suitable process including one or more of vacuum application and inert gas flow. In some embodiments, the second purge 135 uses a combination of inert gas (e.g., Ar, He) with vacuum. In some embodiments, the second purge gas and the first purge gas are the same gas. The second purge time can be any suitable time to remove the unreacted species and byproducts from the substrate surface. A shorter second purge time can provide a process with greater throughput as long as there are substantially no compounds remaining that can react with the subsequent process gases.

After purging, the method 100 includes an optional process 140 as part of the deposition sequence 115. The optional process 140 includes exposure to an aluminum precursor at 150 and a following purge at 155. If the optional process 140 is performed, both aluminum precursor and purging occurs.

In 150, the titanium nitride film formed after exposure to the nitrogen reactant in 130 is exposed to an aluminum precursor to form a TiAlN film. The aluminum precursor can be any suitable aluminum precursor including, but not limited to, aluminum halides and organic aluminum compounds. In some embodiments, the aluminum precursor comprises an aluminum halide. The aluminum halide can be a chloride, bromide or iodide containing compound. In some embodiments, the aluminum halide comprises substantially no fluorine atoms. As used in this regard, the term "substantially no fluorine atoms" means that the halogen atoms in the precursor comprises less than or equal to about 1%, 0.5% or 0.1% fluorine atoms on an atomic basis. In some embodiments, the aluminum precursor comprises substantially only $AlCl_3$. In some embodiments, the aluminum precursor comprises substantially only $AlBr_3$. In some embodiments, the aluminum precursor comprises substantially only aluminum triiodide ($AlI_3$). As used in this regard, the term "substantially only" means that the reactive species of the aluminum precursor is greater than or equal to about 95%, 98% or 99% of the stated species on a molar basis. In some embodiments, the aluminum precursor comprises a mixed halide aluminum compound having the general formula $AlCl_xBr_yI_z$, where the sum of x, y and z is 3.

In some embodiments, the aluminum precursor comprises an organic aluminum compound. Suitable organic aluminum compounds include, but are not limited to, trimethylaluminum (TMA), triethylaluminum (TEA) or mixed methyl/ethyl aluminums. In some embodiments, the aluminum precursor comprises a compound having the general formula $AlR_3$, where each R is independently a C1-C6 branched or un-branched alkyl.

In some embodiments, the aluminum precursor consists essentially of one or more of an aluminum halide or an organic aluminum compound. In some embodiments, the aluminum precursor consists essentially of one or more of trimethylaluminum (TMA) or triethylaluminum (TEA). As used in this regard, the term "consists essentially of" means that the sum of the reactive species is greater than or equal to about 95%, 98% or 99% of the stated species. Inert, diluent or carrier gases are not included in the percent calculation.

The dose time for the aluminum precursor can be adjusted to ensure that the surface reaction is self-terminating. The dose time for the aluminum precursor may be referred to as the third dose time to indicate that it is different than the first dose time associated with the titanium precursor and the second dose time associated with the nitrogen reactant. For example, once the precursor compound has adsorbed to the substrate surface to cover all of the active sites, no further surface reactions can occur. In some embodiments, the third dose time for the aluminum precursor is in the range of about 0.5 to about 20 seconds. In some embodiments, the dose time for the titanium precursor is in the range of about 1 to about 10 seconds.

Once the dose time for the aluminum precursor has been reached, the processing chamber is purged at third purge 155 to remove unreacted aluminum precursor and/or reaction byproducts from the processing chamber and the substrate surface. The third purge 155 can be accomplished using any suitable process including one or more of vacuum application and inert gas flow. In some embodiments, the third purge 155 uses a combination of inert gas (e.g., Ar, He) with vacuum. The third purge time can be any suitable time to remove the unreacted precursor and byproducts from the substrate surface. A shorter third purge time can provide a process with greater throughput as long as there are substantially no compounds remaining that can react with the subsequent process gases.

After the third purge 155, or second purge 135 if optional process 140 is not followed, the deposition sequence 115 completes and moves to decision point 160. In some embodiments, there is no nitrogen exposure immediately after purging the unreacted aluminum precursor. As used in this manner, immediately after means as the next process that reacts with the substrate surface.

At decision point 160, the thickness of the TiAlN film is considered. If the film has reached a predetermined thickness or predetermined aluminum content, the substrate can be subjected to some post-processing 160. If the predetermined thickness or aluminum content has not been reached, the method 100 repeats deposition sequence 115. Each repetition of deposition sequence 115 an independently include the option process 140 so that the optional process is performed in all of the deposition sequences or in some of the deposition sequences.

Some embodiments further comprise varying the dose time of one or more of the titanium precursor, nitrogen reactant or aluminum precursor to change an aluminum content of the TiAlN film. One or more embodiments further comprise varying a dose time of one or more of the titanium precursor, first purge gas, nitrogen reactant, second purge gas, aluminum precursor or third purge gas, to change an aluminum content of the TiAlN film.

The TiAlN film formed by method 100 can have an aluminum content in the range of about 0.5% to about 25% on an atomic basis. In some embodiments, the TiAlN film has an aluminum content in the range of about 1% to about 20%, or in the range of about 2% to about 20%, or in the range of about 3% to about 15%, or in the range of about 4% to about 12%, or in the range of about 5% to about 10% on an atomic basis.

The thickness of the TiAlN film can be any suitable thickness. In some embodiments, the method allows for the deposition of thin films (<20 Å) with a controllable aluminum content. In one or more embodiments, the thickness is in the range of about 10 Å to about 1000 Å, or in the range of about 15 Å to about 100 Å.

Figure 2:
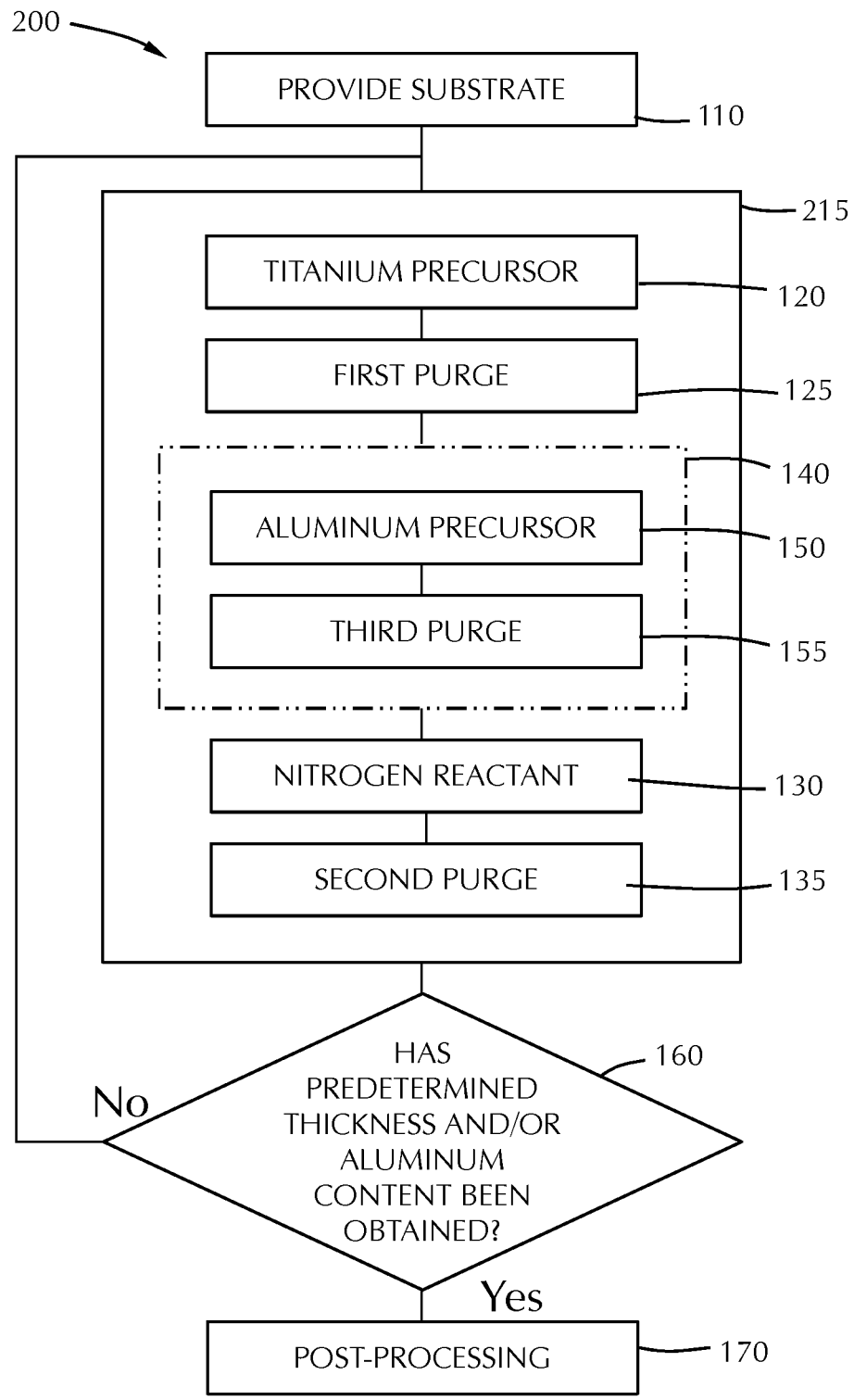
FIG. 2 illustrates a processing method in accordance with one or more embodiment of the disclosure.

FIG. 2 shows another method 200 of depositing a TiAlN film on a substrate surface. In method 200, the substrate surface is exposed to a deposition sequence 215. In deposition sequence 215, the substrate surface is exposed to the titanium precursor at 120 and the first purge 125. After the first purge 125, optional process 140 may or may not be performed. The optional process 140 includes exposure to the aluminum precursor at 150 and the third purge 155 that follows. The optional process 140 can be performed or not during any individual repetition of the deposition sequence 215.

After the first purge 125 or third purge 155, if the optional process 140 is performed, substrate surface is exposed to the nitrogen reactant at 130 and second purge 135. The decision point 160 considers the thickness or aluminum content of the TiAlN film formed by the deposition sequence 215. If the TiAlN film has the predetermined properties (e.g., thickness, aluminum content), the substrate can be subjected to post-processing 170. If the TiAlN film does not have the predetermined properties, the deposition sequence 215 is repeated.

In one or more embodiments, the method begins with exposure to the nitrogen reactant before exposure to the titanium precursor. Some embodiments of the disclosure are directed to methods in which the titanium precursor and aluminum precursor exposures occur together. Co-flowing the titanium and aluminum precursors may form a film with an uniform aluminum content throughout the thickness of the film. In some embodiments, the method repeats cycles of titanium nitride and aluminum nitride deposition. Each cycle comprises exposure to the metal precursor (i.e., titanium precursor or aluminum precursor) followed by exposure to a nitrogen reactant.

The resistivity of the TiAlN film can vary with aluminum composition. In some embodiments, the resistivity of the TiAlN film produced is in the range of about 200 μΩ-cm to about 400 μΩ-cm, or in the range of about 250 μΩ-cm to about 350 μΩ-cm. In some embodiments, the resistivity of the TiAlN film is less than or equal to about 500 μΩ-cm, 450 μΩ-cm, 400 μΩ-cm or 350 μΩ-cm and greater than or equal to about 50 μΩ-cm, 100 μΩ-cm, 150 μΩ-cm or 200 μΩ-cm. It has been surprisingly found that TiAlN films with higher aluminum content (e.g., greater than about 15%) may have a markedly higher resistivity.

Some embodiments of the disclosure are used to deposit high-k caps for nMOS or high-k caps for pMOS or as a p-work function metal. In some embodiments, the method is used to deposit a TiAlN film as a work function layer without changing the equivalent oxide thickness (EOT) of the film.

EXAMPLES

A first TiAlN film was deposited according to the method of FIG. 1 and a second film was deposited according to the method of FIG. 2. The samples were prepared using $TiCl_4$, $AlCl_3$ and $NH_3$. The dose times and conditions were the same for each method. The TiAlN film formed by the method of FIG. 1 resulted in a film with 4.4% aluminum. The film formed by the method of FIG. 2 had an aluminum content of 1.0%.

Figure 3:
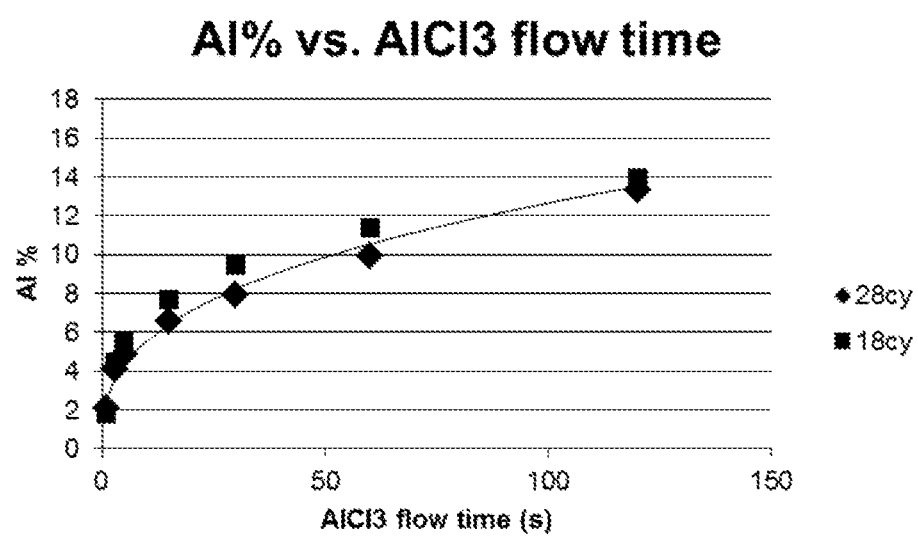
FIG. 3 shows a graph of the aluminum content as a function of aluminum precursor flow time.

Films of TiAlN were formed according to the method of FIG. 1 using $TiCl_4$, $AlCl_3$ and $NH_3$ with varying aluminum precursor exposure. The thicknesses of the films were less than about 20 Å. The results are shown in FIG. 3 for processes following 18 cycles of the deposition sequence and 28 cycles of the deposition sequence.

Films of TiAlN were formed by co-flowing $TiCl_4$ and $AlCl_3$ for five seconds. The $TiCl_4$ flow rate was about 50 sccm (measured for the carrier gas) and the $AlCl_3$ flow rate was about 800 sccm (measured for the carrier gas). The process chamber was purged with an inert gas for five seconds followed by exposure to ammonia for three seconds and purging for another five seconds. The ammonia flow rate was about 4500 sccm. The pressure was about 25 Torr throughout the process. The temperature during deposition was 80° C. or 100° C. The aluminum content at 80° C. was about 2.7% and the aluminum content at 100° C. was about 4%.

Film of TiAlN were prepared by co-flowing the $TiCl_4$ and $AlCl_3$ for five seconds, purging for five seconds, flowing ammonia for three seconds and purging for another five seconds. The flow rates of the $TiCl_4$ and $AlCl_3$ were modified and the aluminum content of the films was measured. The ammonia flow rate was the same for each sample at about 4500 sccm and the pressure was maintained at about 25 Torr throughout. The results are collected in Table 1.

TABLE 1

| $TiCl_4$ Flow | $AlCl_3$ Flow | Al content (%) |
|---|---|---|
| 5 | 50 | 4.50 |
| 5 | 100 | 5.50 |
| 5 | 200 | 5.49 |
| 5 | 800 | 7.02 |
| 10 | 50 | 3.11 |

TABLE 1-continued

| $TiCl_4$ Flow | $AlCl_3$ Flow | Al content (%) |
|---|---|---|
| 10 | 100 | 3.73 |
| 10 | 200 | 4.20 |
| 10 | 800 | 5.63 |

Sample films of TiAlN were prepared following the method of FIG. 1 with a $TiCl_4$ flow rate of about 50 sccm (measured for the carrier gas), an ammonia flow rate of about 4500 sccm and a variable flow rate for $AlCl_3$ of about 50 to about 400 sccm (measured for the carrier gas). The resistivities of the resultant films were measured and the results are collected in Table 2.

TABLE 2

| % Al | Resistivity (μΩ-cm) |
|---|---|
| 7 | 300.48 |
| 10 | 299.88 |
| 12 | 301.11 |
| 16 | 1050.26 |

Bulk deposition of TiAlN films using the method of FIG. 1 was performed to different thickness. It was observed that a 15 Å TiAlN film had a bulk composition of about 14.3% Al and a 150 Å TiAlN film had a bulk composition of about 6.7% Al.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing a TiAlN film on a substrate surface, the method comprising:
   exposing the substrate surface to a titanium precursor to form a titanium-containing film on the substrate surface;
   purging unreacted titanium precursor from the substrate surface;
   exposing the titanium-containing film on the substrate surface to a nitrogen reactant to form a TiN film on the substrate surface;
   purging unreacted nitrogen reactant from the substrate surface; and
   exposing the TiN film on the substrate surface to an aluminum precursor to form a TiAlN film, wherein the titanium precursor comprises substantially only $TiBr_4$.

2. The method of claim 1, further comprising purging unreacted aluminum precursor.

3. The method of claim 2, wherein there is no nitrogen exposure immediately after purging the unreacted aluminum precursor.

4. The method of claim 1, wherein the nitrogen reactant comprises one or more of ammonia, hydrazine or molecular nitrogen.

5. The method of claim 4, wherein the nitrogen reactant is not provided as a plasma.

6. The method of claim 1, wherein the aluminum precursor comprises an aluminum halide.

7. The method of claim 1, wherein the aluminum precursor consists essentially of one or more of an aluminum halide or an organic aluminum compound.

8. The method of claim 1, wherein the aluminum precursor consists essentially of one or more of trimethylaluminum (TMA) or triethylaluminum (TEA).

9. The method of claim 1, further comprising varying a dose time of one or more of the titanium precursor, nitrogen reactant or aluminum precursor to change an aluminum content of the TiAlN film.

10. The method of claim 1, wherein the substrate surface comprises silicon oxide.

11. A method of depositing a TiAlN film on a substrate surface, the method comprising repeatedly exposing the substrate surface to a deposition sequence, the deposition sequence consisting essentially of, in order, exposures to a titanium precursor, a first purge gas, a nitrogen reactant, a second purge gas and an optional aluminum precursor and third purge, wherein the aluminum precursor and third purge are not immediately followed by a nitrogen exposure, and wherein the titanium precursor comprises substantially only $TiBr_4$.

12. The method of claim 11, wherein the nitrogen reactant comprises one or more of ammonia, hydrazine or molecular nitrogen.

13. The method of claim 11, wherein the nitrogen reactant is not provided as a plasma.

14. The method of claim 11, further comprising varying a dose time of one or more of the titanium precursor, first purge gas, nitrogen reactant, second purge gas, aluminum precursor or third purge gas, to change an aluminum content of the TiAlN film.

15. A method of depositing a TiAlN film on a substrate surface, the method comprising repeatedly exposing the substrate surface to a deposition sequence, the deposition sequence consisting essentially of, in order:
  exposing the substrate surface to a titanium precursor for a first dose time, the titanium precursor comprising substantially only $TiBr_4$;
  purging unreacted titanium precursor for a first purge time;
  exposing the substrate surface to a nitrogen reactant for a second dose time, the nitrogen reactant comprising one or more of ammonia or hydrazine and the nitrogen reactant begin free of plasma;
  purging unreacted nitrogen reactant for a second purge time; and
  optionally, exposing the substrate surface to an aluminum precursor for a third dose time followed by purging unreacted aluminum precursor for a third purge time,
wherein one or more of the first dose time, the first purge time, the second dose time, the second purge time, the third dose time or the third purge time are controlled to deposit a TiAlN film with a controlled amount of aluminum.

* * * * *